United States Patent
Lu (10) Patent No.: US 11,894,419 B2
(45) Date of Patent: Feb. 6, 2024

(54) DOUBLE-SIDED CAPACITOR AND FABRICATION METHOD THEREOF

(71) Applicant: CHANGXIN MEMORY TECHNOLOGIES, INC., Hefei (CN)

(72) Inventor: Yong Lu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 270 days.

(21) Appl. No.: 17/503,607

(22) Filed: Oct. 18, 2021

(65) Prior Publication Data

US 2022/0037460 A1 Feb. 3, 2022

Related U.S. Application Data (63) Continuation of application No. PCT/CN2021/097161, filed on May 31, 2021.

(30) Foreign Application Priority Data

Jun. 4, 2020 (CN) .......................... 202010498454.1

(51) Int. Cl.
*H10B 12/00* (2023.01)
*H10N 97/00* (2023.01)
(Continued)

(52) U.S. Cl.
CPC .............. *H01L 28/91* (2013.01); *H01L 28/87* (2013.01); *H01L 28/88* (2013.01); *H01L 28/92* (2013.01); *H10B 12/00* (2023.02)

(58) Field of Classification Search
CPC ......... H01L 28/40; H01L 28/86; H01L 28/87; H01L 28/88; H01L 28/90; H01L 28/91;
(Continued)

(56) References Cited

U.S. PATENT DOCUMENTS

2001/0053576 A1* 12/2001 DeBoer .................. H01L 28/91
257/E27.087
2005/0106806 A1 5/2005 Fishburn et al.
(Continued)

FOREIGN PATENT DOCUMENTS

CN 100338759 C 9/2007
CN 107093604 A * 8/2017 ............. H10B 12/30
(Continued)

OTHER PUBLICATIONS

Wu, Semiconductor memory structure and manufacturing method thereof; Aug. 24, 2018; Translation of CN-108447864-A; Aug. 24, 2018.*
(Continued)

*Primary Examiner* — Omar F Mojaddedi
(74) *Attorney, Agent, or Firm* — Ladas & Parry LLP (57) ABSTRACT

The present application relates to a fabrication method for a double-sided capacitor. The fabrication method for the double-sided capacitor includes the following steps: providing a substrate; forming a stack structure on the substrate; forming a capacitor hole in a direction perpendicular to the substrate to penetrate the stack structure, wherein the stack structure includes sacrificial layers and supporting layers alternately stacked; forming an auxiliary layer to cover the sidewall of the capacitor hole; forming a first electrode layer to cover the surface of the auxiliary layer; removing a part of the supporting layer on the top of the stack structure; removing the sacrificial layers and the auxiliary layer simultaneously along the opening; and forming a dielectric layer covering the surface of the first electrode layer and a second electrode layer covering the surface of the dielectric layer, wherein the gap is at least filled with the dielectric layer.

18 Claims, 7 Drawing Sheets

(51) Int. Cl.
*H01L 23/522* (2006.01)
*H01L 49/02* (2006.01)

(58) Field of Classification Search
CPC ......... H01L 28/92; H10B 12/00; H10B 12/03; H10B 12/033; H10B 12/30; H10N 97/00
See application file for complete search history.

(56) References Cited

U.S. PATENT DOCUMENTS

| | | | |
|---|---|---|---|
| 2019/0074349 A1* | 3/2019 | Lin | H01L 28/92 |
| 2019/0348417 A1* | 11/2019 | Yokoyama | H10B 12/033 |
| 2020/0058654 A1* | 2/2020 | Yang | H10B 12/315 |
| 2020/0058732 A1* | 2/2020 | Lu | H01L 28/92 |
| 2021/0183873 A1* | 6/2021 | Goodwin | H10B 12/05 |
| 2022/0328494 A1 | 10/2022 | Zhang et al. | |

FOREIGN PATENT DOCUMENTS

| | | | | |
|---|---|---|---|---|
| CN | 107093604 | A | | 8/2017 |
| CN | 108447864 | A * | 8/2018 | ....... H01L 27/10805 |
| CN | 108447864 | A | | 8/2018 |
| CN | 110416212 | A | | 11/2019 |

OTHER PUBLICATIONS

Unnamed; Dynamic access random memory and manufacturing method thereof; Aug. 25, 2017; Translation of CN-107093604-A; Aug. 25, 2017.*
ISR for International Application PCT/CN2021/097161 dated Sep. 2, 2021.
Written Opinion for International Application PCT/CN2021/097161 dated Sep. 2, 2021.

* cited by examiner

DOUBLE-SIDED CAPACITOR AND FABRICATION METHOD THEREOF

CROSS-REFERENCE TO RELATED APPLICATIONS

This application is a continuation of International Patent Application No. PCT/CN2021/097161 filed on May 31, 2021, which claims priority to Chinese Patent Application No. 202010498454.1 filed on Jun. 4, 2020. The above-referenced patent applications are incorporated herein by reference in their entirety.

TECHNICAL FIELD

The present invention relates to the field of semiconductor fabrication technologies, and in particular, to a double-sided capacitor and a fabrication method thereof.

BACKGROUND

A dynamic random access memory (DRAM) is of a semiconductor structure commonly used in an electronic device, such as a computer. The DRAM consists of a plurality of memory units, each memory of which generally includes a capacitor for storing charges and a transistor accessing the capacitor. A gate of the transistor is electrically connected with a wordline, a source of the transistor is electrically connected with a bitline, and a drain of the transistor is electrically connected with the capacitor. A bitline voltage on the bitline is capable of controlling ON or OFF of the transistor. Accordingly, data information stored in the capacitor may be read by the bitline or written into the capacitor. The DRAM stores data in a form of the charges on the capacitor, so that the capacitor is regularly recharged within a time interval of every a few milliseconds. However, the higher a capacitance value of the capacitor is, the longer the data stored in the DRAM may be maintained.

Since a depth-to-width ratio of the capacitor in the DRAM is continuously increased, a capacitor hole easily peels in a process of forming a double-sided capacitor, or declines or bends in a subsequence procedure, which will result in a decrease of the yield of the DRAM.

Accordingly, it is an urgent problem to be solved to increase the stability of the double-sided capacitor, improve the performance of the double-sided capacitor and increase the yield of the DRAM.

SUMMARY

The present application provides a double-sided capacitor and a fabrication method thereof, to solve the problem of poor stability of an existing double-sided capacitor, so as to improve the performance of the double-sided capacitor and increase the yield of a DRAM.

In order to solve the above problems, the present application provides a fabrication method for a double-sided capacitor, which includes the following steps:

providing a substrate, wherein a capacitor contact pad is formed on the surface of the substrate;

forming a stack structure on the substrate to cover the capacitor contact pad;

forming a capacitor hole in a direction perpendicular to the substrate to penetrate the stack structure and expose the capacitor contact pad, wherein the stack structure includes sacrificial layers and supporting layers alternately stacked;

forming an auxiliary layer to cover a sidewall of the capacitor hole;

forming a first electrode layer to cover a surface of the auxiliary layer and the exposed capacitor contact pad;

removing a part of the supporting layer on the top of the stack structure to form an opening to expose the sacrificial layers;

removing the sacrificial layers and the auxiliary layer simultaneously along the opening to form a gap between the supporting layers and the first electrode layer; and forming a dielectric layer covering a surface of the first electrode layer and a second electrode layer covering a surface of the dielectric layer, wherein the gap is at least filled with the dielectric layer.

In order to solve the above problems, the present application further provides a double-sided capacitor, including:

a substrate, having a capacitor contact pad on its surface;

a top supporting layer and a middle supporting layer, each of which is provided with a number of capacitor pores, and on a plane parallel to the substrate, a projection area of the middle supporting layer is greater than that of the top supporting layer;

a first electrode layer, being of a shape of a hollow column with an opening in a top, wherein the first electrode layer is perpendicular to the surface of the substrate and penetrates the top supporting layer and the middle supporting layer through the capacitor pores, wherein the bottom of the first electrode layer is in contact with the capacitor contact pad;

a dielectric layer, covering the surfaces of the first electrode layer, the top supporting layer and the middle supporting layer; and a second electrode layer, covering the surface of the dielectric layer.

DESCRIPTION OF EMBODIMENTS

The detailed description of a double-sided capacitor and its fabrication method provided in the present application will be described in detail below with reference to accompanying drawings.

Figure 1:
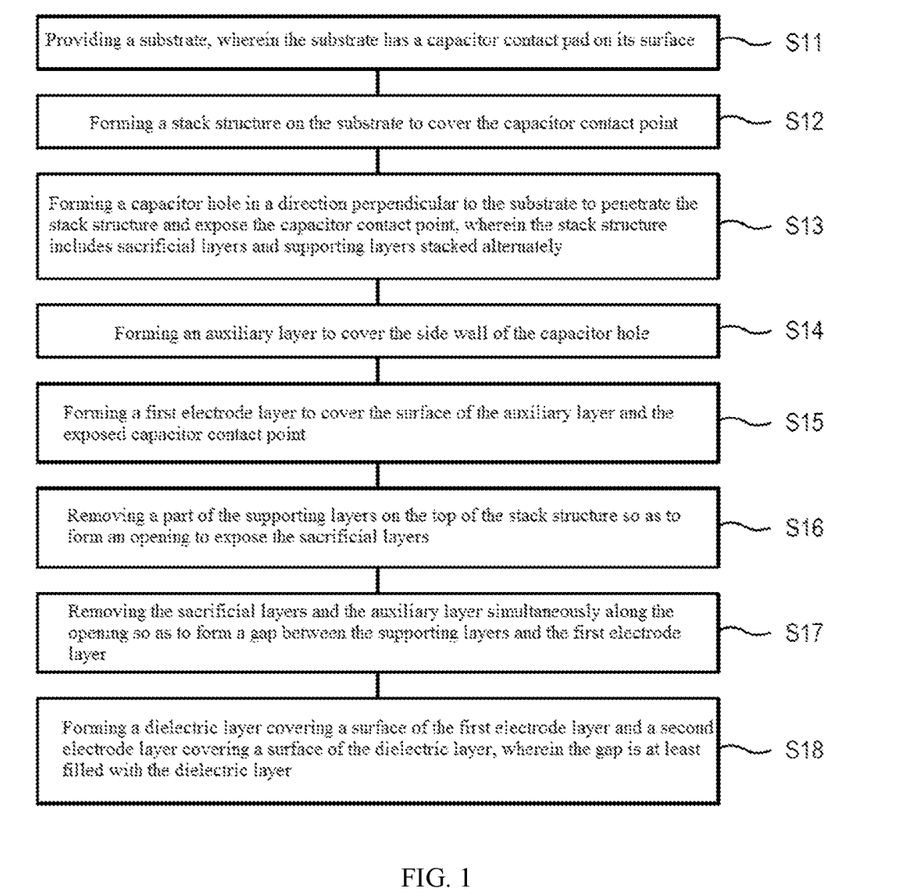
FIG. 1 is a flowchart of a fabrication method for a double-sided capacitor according to a specific embodiment of the present application.
Figure 2A:
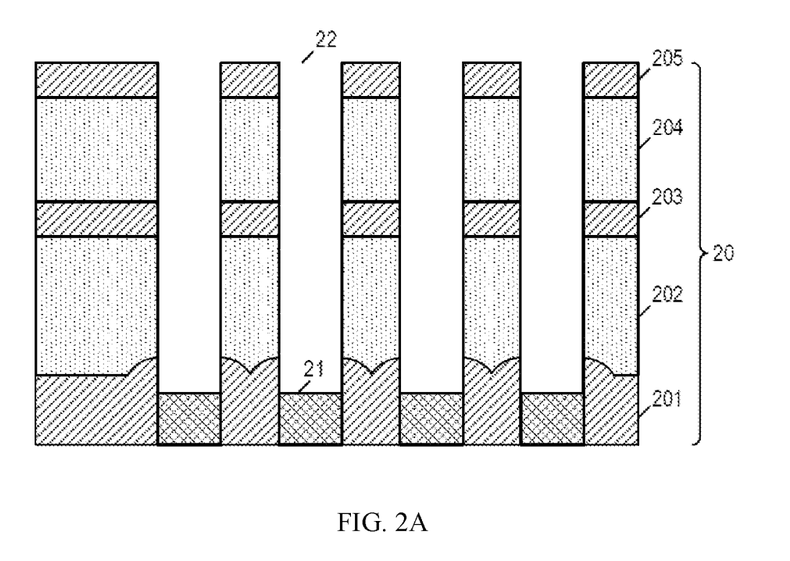
FIG. 2A to FIG. 2L are schematic cross-sectional views of a main process in a procedure for forming a double-sided capacitor according to a specific embodiment of the present application.

A specific embodiment provides a fabrication method for a double-sided capacitor. FIG. 1 is a flowchart of a fabrication method for a double-sided capacitor according to a specific embodiment of the application. FIG. 2A to FIG. 2L are schematic cross-sectional views of a main process in a procedure for forming a double-sided capacitor according to a specific embodiment of the present application. The double-sided capacitor described in the described description may be, but is not limited to, applied to a DRAM memory. As shown in FIG. 1 and FIG. 2A to FIG. 2L, the fabrication method for the double-sided capacitor provided in the specific embodiment includes the following steps:

in step S11, a substrate is provided, wherein the substrate has a capacitor contact pad 21 on its surface, as shown in FIG. 2A;

in step S12, a stack structure 20 is formed on the substrate to cover the capacitor contact pad 21;

in step S13, a capacitor hole 22 is formed in a direction perpendicular to the substrate to penetrate the stack structure 20 and expose the capacitor contact pad 21, wherein the stack structure 20 includes sacrificial layers and supporting layers alternately stacked, as shown in FIG. 2A.

Optionally, a specific step of forming the stack structure 20 on the substrate involves:

a first supporting layer 201, a first sacrificial layer 202, a second supporting layer 203, a second sacrificial layer 204 and a third supporting layer 205 are sequentially deposited on the substrate from bottom to top to form the stack structure 20, wherein the stack structure 20 covers the capacitor contact pad 21, as shown in FIG. 2A.

Specifically, the substrate is internally provided with a plurality of active regions arranged in an array, and the capacitor contact pad 21 is connected with the active regions. The substrate may be, but not limited to, made of silicon. The capacitor contact pad 21 may be, but not limited to, made of tungsten. A plurality of the sacrificial layers and the supporting layers are alternately stacked in a direction perpendicular to the substrate, and the number of the sacrificial layers and the supporting layers alternately stacked may be selected by those skilled in the art according to actual needs. In this specific embodiment, the number of the supporting layers in the stack structure 20 is at least 3, and the number of the sacrificial layers is at least 2. Accordingly, the lateral stability of a capacitor array region is enhanced. The sacrificial layers may be, but not limited to, made of an oxide material, for example, silicon dioxide. The supporting layers may be, but not limited to, made of a nitride material, for example, silicon nitride.

After the sacrificial layers and the supporting layers alternately stacked are formed, the stack structure 20 may be etched by a dry etching process to form the capacitor hole 22 penetrating the stack structure 20 and exposing the capacitor contact pad 21.

Figure 2B:
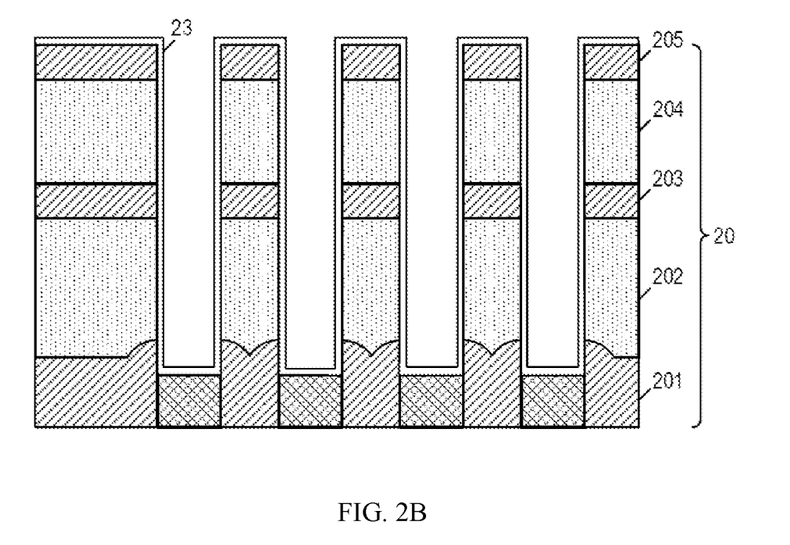
Figure 2C:
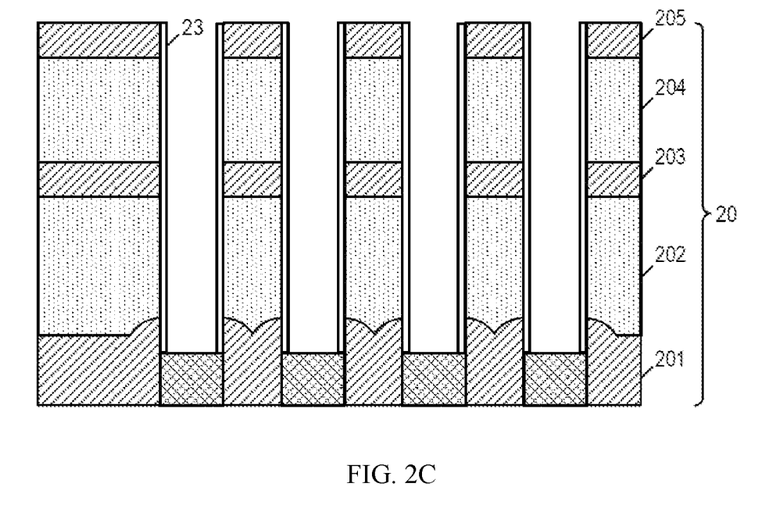

In step S14, an auxiliary layer 23 is formed to cover a sidewall of the capacitor hole 22, as shown in FIG. 2C.

Specifically, after the capacitor hole 22 is formed, the auxiliary layer 23 covering an inner wall of the capacitor hole 22 (including a sidewall and a bottom wall of the capacitor hole 22) and the surface of the third supporting layer 205 is deposited by using a chemical vapor deposition process, a physical vapor deposition process, or an atomic layer deposition process, as shown in FIG. 2B. Afterwards, the auxiliary layer 23 is etched back to remove the auxiliary layer 23 covering the surface of the third supporting layer 205 and the bottom wall of the capacitor hole 22, only reserving the auxiliary layer 23 covering the side wall of the capacitor hole 22, as shown in FIG. 2C.

In this specific embodiment, the auxiliary layer 23 may be of a monolayer structure or a multilayer structure stacked in a radial direction of the capacitor hole 22, which may be selected by those skilled in the art according to actual needs.

Figure 2D:
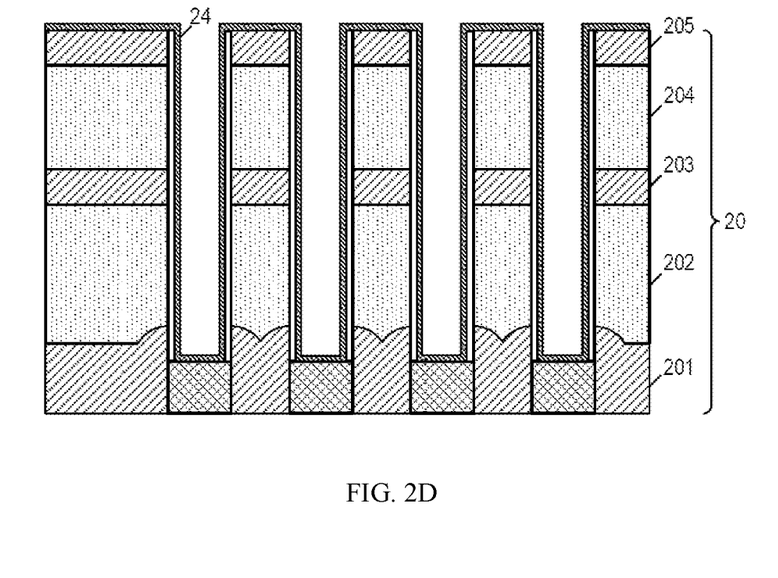

In step S15, a first electrode layer 24 is formed to cover the surface of the auxiliary layer 23 and the exposed capacitor contact pad 21, as shown in FIG. 2D.

Specifically, after the auxiliary layer 23 covering the side wall of the capacitor hole 22 is formed, a conductive material such as titanium nitride is deposited on the surface of the auxiliary layer 23, the bottom wall of the capacitor hole 22, and the surface of the third supporting layer 205 to form the first electrode layer 24 as shown in FIG. 2D.

Figure 2E:
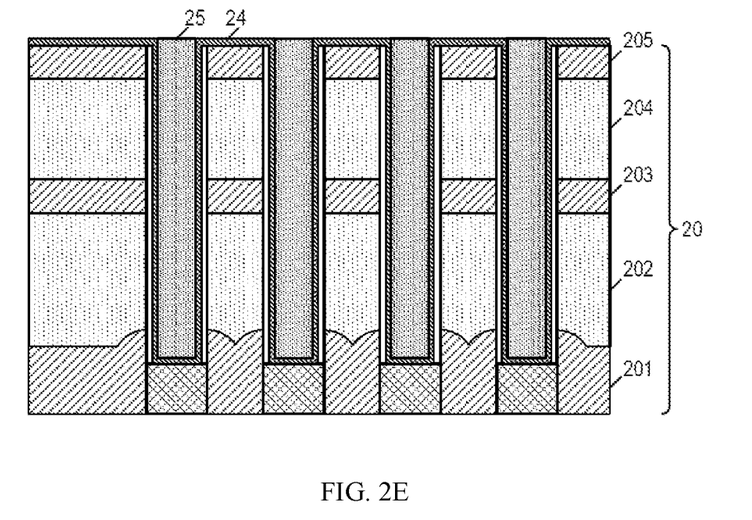
Figure 2F:
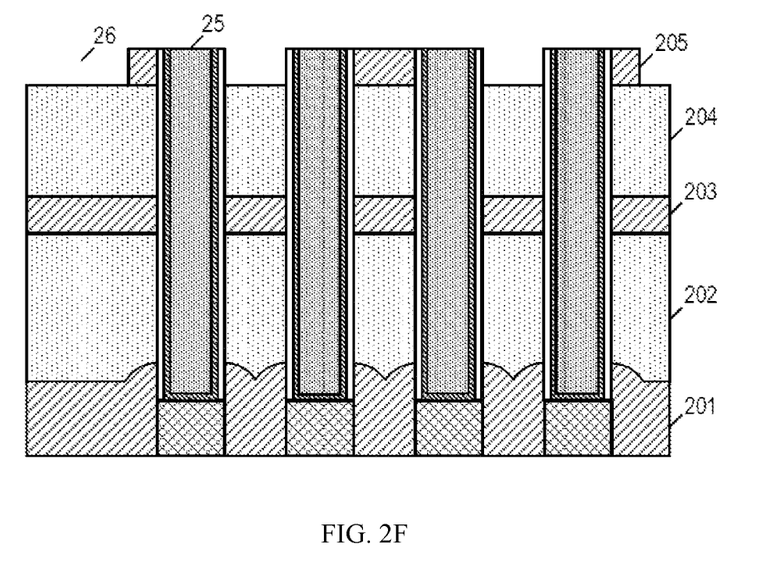

In step S16, a part of the supporting layer on the top of the stack structure 20 is removed to form an opening 26 to expose the sacrificial layers, as shown in FIG. 2F.

Optionally, before a part of the supporting layer on the top of the stack structure 20 is removed, the fabrication method further includes the following step:

a filling layer 25 is formed on the surface of the first electrode layer 24 to fill the capacitor hole 22, as shown in FIG. 2E.

Specifically, before the third supporting layer 205 of the stack structure 20 is etched, the filling layer 25 is deposited within the capacitor hole 22, so that the filling layer 25 fills the capacitor hole 22 so as to prevent the first electrode layer 24 from overturning or collapsing in a subsequent etching process. The filling layer 25 may be, but is not limited to, made of carbon or a carbon-containing organic material.

Optionally, a specific step of forming the opening 26 to expose the sacrificial layer involves:

the third supporting layer 205 is etched to form at least one opening 26 to expose the second sacrificial layer 204, wherein each of the openings 26 partially overlaps at least one of the capacitor holes 22.

Figure 2G:
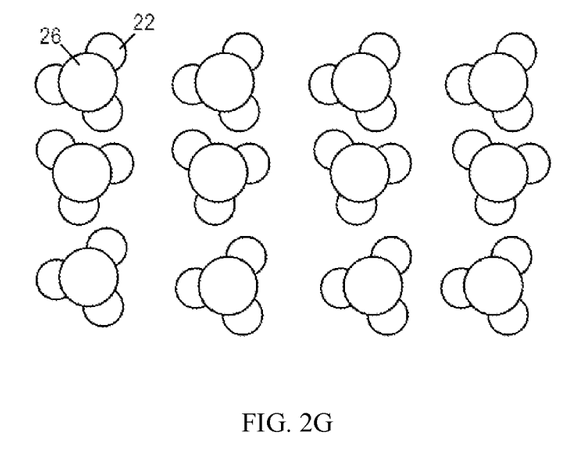

Specifically, after the first electrode layer 24 covering the surface of the third supporting layer 205 is removed, a part of the third supporting layer 205 is etched to form an opening 26 exposing the second sacrificial layer 204. Each of the openings 26 may partially overlap with one or more than two capacitor holes 22. FIG. 2G shows a schematic top view when one of the openings 26 partially overlaps with three of the capacitor holes 22.

Figure 2H:
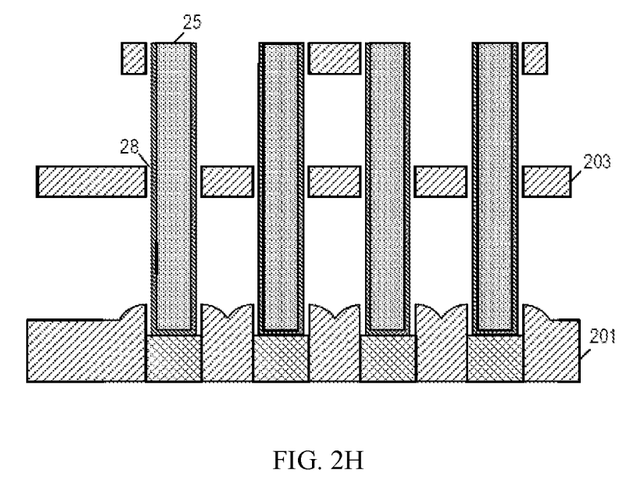

In step S17, the sacrificial layers and the auxiliary layer 23 are simultaneously removed along the opening 26 to form a gap 28 between the supporting layers and the first electrode layer 24, as shown in FIG. 2H.

Optionally, a specific step of removing the sacrificial layer and the auxiliary layer 23 simultaneously along the opening 26 involves:

the second sacrificial layer 204, the first sacrificial layer 202 and the auxiliary layer 23 are simultaneously removed along the opening 26 by employing a wet etching process to form the gap 28 between the first electrode layer 24 and the remaining part of the stack structure 20.

Specifically, the second sacrificial layer 204, the first sacrificial layer 202 and the auxiliary layer 23 are simultaneously removed along the opening 26 by selecting a suitable acidic etching agent in combination with a wet etching process. The acidic etching agent should be able to etch the auxiliary layer 23, the first sacrificial layer 202 and the second sacrificial layer 204 simultaneously without damaging the first supporting layer 201, the second supporting layer 203, the remaining part of the third supporting layer 205 and the first electrode layer 24.

Optionally, the auxiliary layer 23 is made of the same material as the sacrificial layers.

Specifically, the auxiliary layer 23 is made of the same material as the first sacrificial layer 202 and the second sacrificial layer 204, for example, made of silicon dioxide, so that the step of removing the auxiliary layer 23, the first sacrificial layer 202 and the second sacrificial layer 204 simultaneously may be simplified.

Those skilled in the art may fabricate the auxiliary layer 23 by using the different material from the sacrificial layers according to actual needs, and subsequently remove the auxiliary layer 23 and the sacrificial layers simultaneously by selecting a suitable etching agent. In order to sufficiently remove the auxiliary layer 23 and the sacrificial layers, when the auxiliary layer 23 is made of the different material from the sacrificial layer, an etch selectivity ratio between the auxiliary layer 23 and the sacrificial layer should be less than 3.

In this specific embodiment, by selecting a suitable material made into the auxiliary layer 23 and the type of the etching agent, after the second sacrificial layer 204 is removed, the auxiliary layer 23 and the first sacrificial layer may be removed continuously, and the second supporting layer 203 does not need to be etched again, which not only ensures the lateral length of the second supporting layer 203, but also enables the second supporting layer 203 to support two opposite sides of the double-sided capacitor formed subsequently. Accordingly, the stability of the double-sided capacitor is greatly enhanced, the performance of the capacitor is improved, and the yield of the DRAM is increased.

Figure 2I:
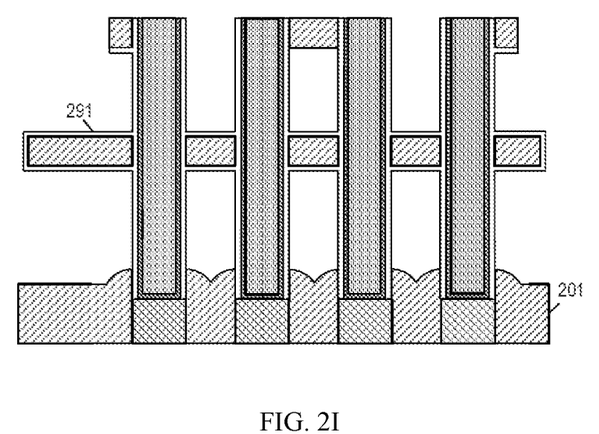
Figure 2J:
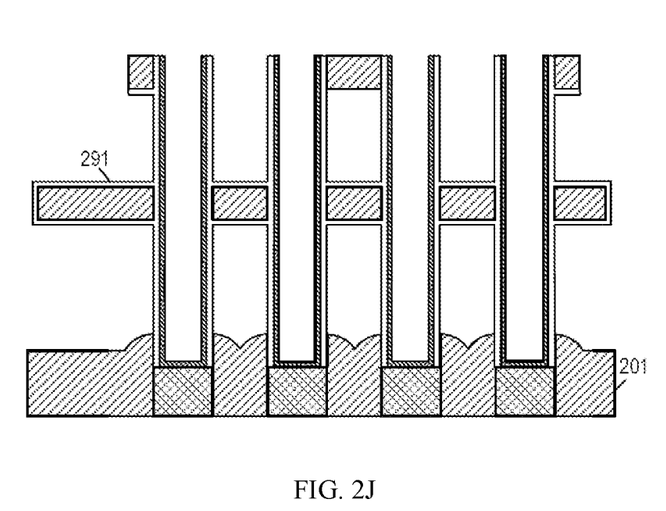
Figure 2K:
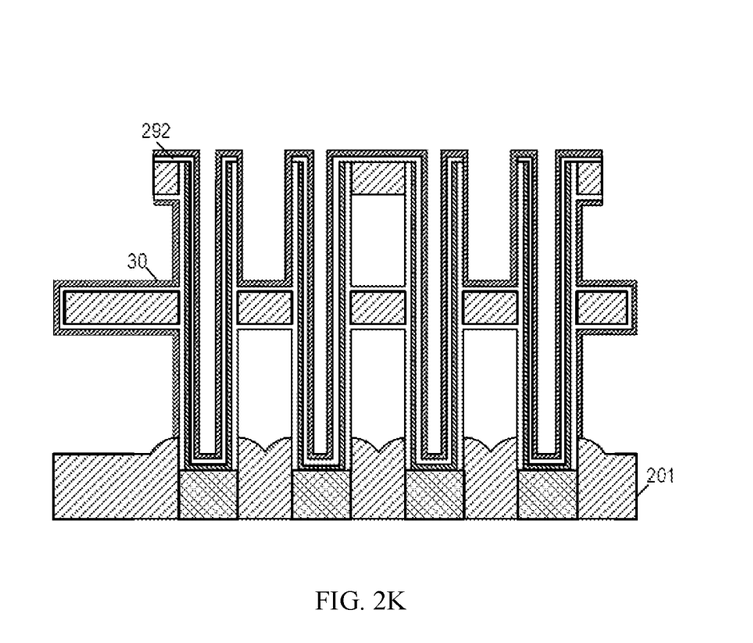

In step S18, a dielectric layer covering the surface of the first electrode layer 24 and a second electrode layer 30 covering the surface of the dielectric layer are formed, wherein the gap 28 is at least filled with the dielectric layer, as shown in FIG. 2K.

Optionally, a specific step of forming the dielectric layer covering the surface of the first electrode layer 24 and the second electrode layer 30 covering the surface of the dielectric layer involves:

a first sub-dielectric layer 291 covering the surface of the first electrode layer 24 is formed in the gap 28, as shown in FIG. 2I;

at least a second sub-dielectric layer 292 covering the surface of the first electrode layer 24 is formed within the capacitor hole 22; and a second electrode layer 30 covering the surface of the first sub-dielectric layer 291 and the surface of the second sub-dielectric layer 292 is formed, as shown in FIG. 2K.

Specifically, after the first sacrificial layer 202, the second sacrificial layer 204 and the auxiliary layer 23 are removed, a dielectric material with a high dielectric constant is deposited on an outer surface (that is, a surface, which is away from the surface of the capacitor hole 22, of the first electrode layer 24) of the first electrode layer 24 to form the first sub-dielectric layer 291, as shown in FIG. 2I. After that, the filling layer 25 filled inside the capacitor hole 22 is removed to expose the capacitor hole 22, as shown in FIG. 2J. For example, when the filling layer 25 is made of carbon, the filling layer 25 may be removed by an ashing process. Next, a dielectric material with a high dielectric constant is deposited on the inner surface (that is, the surface, which faces the capacitor hole 22, of the first electrode layer 24) of the first electrode layer 24 again to form the second sub-dielectric layer 292. In this specific embodiment, the first sub-dielectric layer 291 may be made of the same material as the second sub-dielectric layer 292. The first sub-dielectric layer 291 and the second sub-dielectric layer 292 may have the same thickness. Then, a conductive material such as titanium nitride is deposited on the surface of the first sub-dielectric layer 291 and the surface of the second sub-dielectric layer 292 to form the second electrode layer 30, as shown in FIG. 2K.

Optionally, the second sub-dielectric layer 292 is further formed in the gap 28 and covers the surface of the first sub-dielectric layer 291, and the second electrode layer 30 covers the surface of the second sub-dielectric layer 292.

Specifically, those skilled in the art may deposit a dielectric material with a high dielectric constant on the inner surface (that is, a surface, which faces the capacitor hole 22, of the first electrode layer 24) of the first electrode layer 24 and the surface of the first sub-dielectric layer 291 after removing the filling layer 25 according to actual needs, so that the gap 28 is filled with the first sub-dielectric layer 291 and the second sub-dielectric layer 292 simultaneously. Then, a conductive material such as titanium nitride is deposited on the surface of the second sub-dielectric layer 292 to form the second electrode layer 30.

Figure 2L:
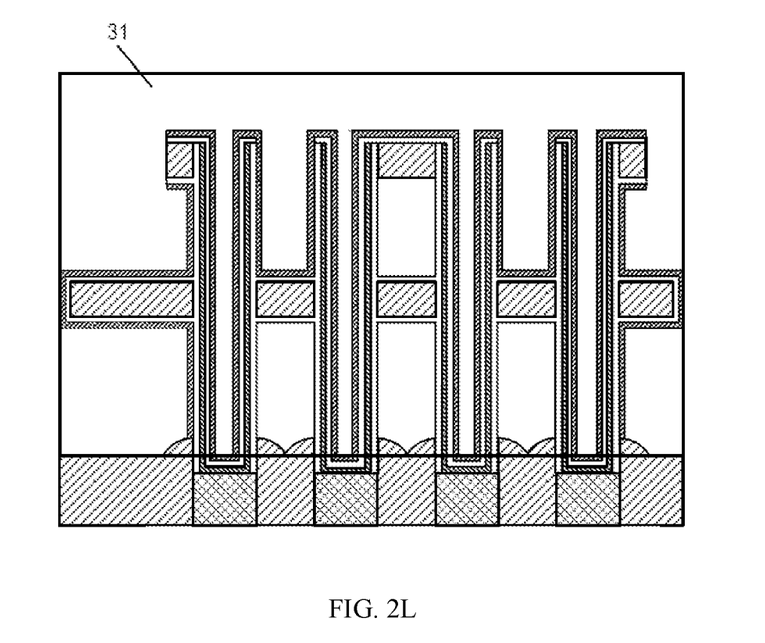

After the second electrode layer 30 is formed, a conductive material such as doped polysilicon is deposited on the surface of the second electrode layer 30 to form a conductive layer 31 covering the second electrode layer 30 and fill the gap between the capacitor hole 22 and the adjacent capacitor hole 22, as shown in FIG. 2L.

In this specific embodiment, the width (that is, the thickness of the auxiliary layer 23) of the gap 28 is less than or equal to the thickness of the first sub-dielectric layer 291, so that the first sub-dielectric layer 291 fills the gap 28. Those skilled in the art may adjust the thickness of the auxiliary layer 23 according to actual needs, so that the width of the gap 28 formed is less than or equal to the sum of the thicknesses of the first sub-dielectric layer 291 and the second electrode layer 30, such that the first sub-dielectric layer 291 and the second electrode layer 30 fill the gap 28 together. Those skilled in the art may adjust the thickness of the auxiliary layer 23 according to actual needs, so that the width of the gap 28 formed is greater than the sum of the thicknesses of the first sub-dielectric layer 291 and the second electrode layer 30, such that most of the first sub-dielectric layer 291, the second electrode layer 30 and a part of the conductive layer 31 fill the gap 28 together.

Furthermore, this specific embodiment further provides a double-sided capacitor. The double-sided capacitor provided in this specific embodiment may be formed by using the method shown in FIG. 1 and FIG. 2A to FIG. 2L. For a schematic diagram of the double-sided capacitor provided in this specific embodiment, reference is made to FIG. 2A to FIG. 2L. As shown in FIG. 2A to FIG. 2L, the double-sided capacitor according to this embodiment includes:

a substrate, having a capacitor contact pad 21 on its surface;

a top supporting layer and a middle supporting layer, each of which is provided with a number of capacitor pores, and on a plane parallel to the substrate, a projection area of the middle supporting layer is greater than that of the top supporting layer;

a first electrode layer 24, being of a shape of a hollow column with an opening in the top, wherein the first electrode layer 24 is perpendicular to the surface of the substrate and penetrates the top supporting layer and the middle supporting layer through the capacitor pores, wherein the bottom of the first electrode layer 24 is connected with the capacitor contact pad 21;

a dielectric layer, covering surfaces of the first electrode layer 24, the top supporting layer and the middle supporting layer; and a second electrode layer 30, covering a surface of the dielectric layer.

By way of the double-sided capacitor formed by the method shown in FIG. 2A to FIG. 2L as an example, the top supporting layer in this specific embodiment serves as the third supporting layer 205, and the middle supporting layer serves as the second supporting layer 203. The double-sided capacitor further includes a bottom supporting layer (that is, the first supporting layer 201) below the middle supporting layer. The first electrode layer 24, the dielectric layer and the second electrode layer 30 together form a capacitor. The top supporting layer is internally provided with a capacitor pore penetrating the top supporting layer in a direction perpendicular to the substrate, and the middle supporting layer is internally provided with a capacitor pore penetrating the middle supporting layer in a direction perpendicular to the substrate.

On a plane parallel to the substrate, the projection area of the intermediate supporting layer is greater than that of the top supporting layer, which means that the middle supporting layer is larger than the top supporting layer at least in terms of a lateral extension length. A projection of the middle supporting layer completely covers a projection of the top supporting layer. there will be a sidewall of the supporting layer (including the top supporting layer and the middle supporting layer) surrounding the entire capacitor at the edge of the capacitor, and the capacitor is connected with the top supporting layer and the middle supporting layer and vertically disposed on the substrate, so as to achieve stable support for the capacitor.

Optionally, projections of the capacitor pores in the middle supporting layer and the top supporting layer on the substrate overlap.

Specifically, the capacitor pore in the middle supporting layer is aligned with the capacitor pore in the top supporting layer, and the capacitor pores in the middle supporting layer and in the top supporting layer have the same size, so as to better support the capacitor.

Optionally, the double-sided capacitor further includes:
a conductive layer 31, covering the surface of the second electrode layer 30.

As for the double-sided capacitor and its fabrication method provided in the present application, firstly, the auxiliary layer is formed on the sidewall of the capacitor hole, and then after the supporting layer on the top of the stack structure is opened, the auxiliary layer and all the sacrificial layers in the stack structure are removed simultaneously by selecting a suitable etching agent. Accordingly, there is no need for etching other supporting layers in the stack structure, so that the supporting layer located in the middle of the stack structure is capable of simultaneously supporting two opposite sides of a double-sided capacitor. In an aspect, the lateral stability of the double-sided capacitor may be improved, and thus the yield of the DRAM is increased. In another aspect, since the step for etching the supporting layer in the stack structure may be reduced, a process for forming the double-sided capacitor is favorably simplified, and the process time is shortened.

The above merely describes preferred embodiments of the present application.

It should be pointed that for those skilled in the art, some improvements and polishings, which shall also fall within the protection scope of the present application, may be made without departing the principle of the present application.

What is claimed is:

1. A fabrication method for a double-sided capacitor, comprising the following steps:
   providing a substrate, wherein a capacitor contact pad is formed on a surface of the substrate;
   forming a stack structure on the substrate to cover the capacitor contact pad;
   forming a capacitor hole in a direction perpendicular to the substrate to penetrate the stack structure and expose the capacitor contact pad, wherein the stack structure comprises sacrificial layers and supporting layers alternately stacked;
   forming an auxiliary layer to cover a sidewall of the capacitor hole;
   forming a first electrode layer to cover a surface of the auxiliary layer and the exposed capacitor contact pad;
   removing a part of the supporting layer on a top of the stack structure to form an opening to expose the sacrificial layers;
   removing the sacrificial layers and the auxiliary layer simultaneously along the opening to form a gap between the supporting layers and the first electrode layer; and
   forming a dielectric layer covering a surface of the first electrode layer and a second electrode layer covering a surface of the dielectric layer, wherein the gap is at least filled with the dielectric layer.

2. The fabrication method for the double-sided capacitor according to claim 1, wherein the forming the stack structure on the substrate comprises:
   sequentially depositing a first supporting layer, a first sacrificial layer, a second supporting layer, a second sacrificial layer and a third supporting layer on the substrate from bottom to top to form the stack structure, wherein the stack structure covers the capacitor contact pad.

3. The fabrication method for the double-sided capacitor according to claim 1, wherein before the removing the part of the supporting layer on the top of the stack structure, the method further the following step:
   forming a filling layer on the surface of the first electrode layer to fill the capacitor hole.

4. The fabrication method for the double-sided capacitor according to claim 3, wherein the filling layer is made of carbon or a carbon-containing organic material.

5. The fabrication method for the double-sided capacitor according to claim 2, wherein the forming the opening to expose the sacrificial layer comprises:
   etching the third supporting layer to form at least one opening to expose the second sacrificial layer, wherein each of the openings partially overlaps at least one of the capacitor holes.

6. The fabrication method for the double-sided capacitor according to claim 2, wherein the removing the sacrificial layers and the auxiliary layer simultaneously along the opening comprises:
   removing the second sacrificial layer, the first sacrificial layer, and the auxiliary layer simultaneously along the opening by using a wet etching process to form the gap between the first electrode layer and the remaining part of the stack structure.

7. The fabrication method for the double-sided capacitor according to claim 6, wherein the forming the dielectric layer covering the surface of the first electrode layer and the second electrode layer covering the surface of the dielectric layer comprises:
   forming a first sub-dielectric layer covering the surface of the first electrode layer in the gap;
   removing the filling layer;
   at least forming a second sub-dielectric layer covering the surface of the first electrode layer in the capacitor hole; and
   forming a second electrode layer covering a surface of the first sub-dielectric layer and a surface of the second sub-dielectric layer.

8. The fabrication method for the double-sided capacitor according to claim 7, wherein the second sub-dielectric layer is further formed in the gap and covers the surface of the first sub-dielectric layer, and the second electrode layer covers the surface of the second sub-dielectric layer.

9. The fabrication method for the double-sided capacitor according to claim 1, wherein the auxiliary layer is of a single-layer structure; or, the auxiliary layer is of a multilayer structure stacked in a radial direction of the capacitor hole.

10. The fabrication method for the double-sided capacitor according to claim 1, wherein the auxiliary layer and the sacrificial layer are made of the same material.

11. The fabrication method for the double-sided capacitor according to claim 10, wherein the auxiliary layer and the sacrificial layer are both made of silicon dioxide.

12. A double-sided capacitor, comprising:
a substrate, having a capacitor contact pad on its surface;
a top supporting layer and a middle supporting layer, each of which is provided with a number of capacitor pores, and on a plane parallel to the substrate, a projection area of the middle supporting layer is greater than that of the top supporting layer, wherein the middle supporting layer is opened only at the capacitor pores, and a projection of the capacitor pores on the substrate overlaps with the capacitor contact pad;
a first electrode layer, being of a shape of a hollow column with an opening in the top, wherein the first electrode layer is perpendicular to the surface of the substrate and penetrates the top supporting layer and the middle supporting layer through the capacitor pores, wherein the bottom of the first electrode layer is in contact with the capacitor contact pad;
a dielectric layer, covering the surfaces of the first electrode layer, the top supporting layer and the middle supporting layer; and
a second electrode layer, covering the surface of the dielectric layer.

13. The double-sided capacitor according to claim 12, wherein projections of the capacitor pores in the middle supporting layer and the top supporting layer on the substrate overlap.

14. The double-sided capacitor according to claim 12, wherein the dielectric layer comprises:
a first sub-dielectric layer, covering an outer surface of the first electrode layer; and
a second sub-dielectric layer, covering at least an inner surface of the first electrode layer.

15. The double-sided capacitor according to claim 14, wherein the second sub-dielectric layer further covers a surface of the first sub-dielectric layer, and the second electrode layer covers a surface of the second sub-dielectric layer.

16. The double-sided capacitor according to claim 15, wherein the first sub-dielectric layer and the second sub-dielectric layer are made of the same material.

17. The double-sided capacitor according to claim 15, wherein the first sub-dielectric layer and the second sub-dielectric layer have the same thickness.

18. The double-sided capacitor according to claim 12, further comprising:
a conductive layer, covering the surface of the second electrode layer.

* * * * *